(12) United States Patent
Sears, Jr.

(10) Patent No.: US 7,888,158 B1
(45) Date of Patent: Feb. 15, 2011

(54) SYSTEM AND METHOD FOR MAKING A PHOTOVOLTAIC UNIT

(76) Inventor: James B. Sears, Jr., 12708 Stanwyck Cir., Tampa, FL (US) 33626

( * ) Notice: Subject to any disclaimer, the term of this patent is extended or adjusted under 35 U.S.C. 154(b) by 72 days.

(21) Appl. No.: 12/506,969

(22) Filed: Jul. 21, 2009

(51) Int. Cl.
*H01L 21/00* (2006.01)
(52) U.S. Cl. .................... 438/61; 164/480; 257/E21.04
(58) Field of Classification Search .................... 438/61
See application file for complete search history.

(56) References Cited

U.S. PATENT DOCUMENTS

| | | |
|---|---|---|
| 3,206,808 A | 9/1965 | Robinson |
| 3,353,934 A | 11/1967 | Robinson |
| 3,828,841 A | 8/1974 | Hazelett et al. |
| 3,848,658 A | 11/1974 | Hazelett et al. |
| 3,865,176 A | 2/1975 | Dompas et al. |
| 3,866,665 A | 2/1975 | Schoffmann |
| 3,878,883 A | 4/1975 | Hazelett et al. |
| 3,937,270 A | 2/1976 | Hazelett et al. |
| 3,937,274 A | 2/1976 | Dompas |
| 3,949,805 A | 4/1976 | Hazelett et al. |
| 3,955,615 A | 5/1976 | Dompas et al. |
| 3,963,068 A | 6/1976 | Hazelett et al. |
| 4,002,197 A | 1/1977 | Hazelett et al. |
| 4,056,140 A | 11/1977 | Ives et al. |
| 4,062,235 A | 12/1977 | Hazelett et al. |
| 4,082,101 A | 4/1978 | Hazelett et al. |
| 4,108,714 A | 8/1978 | Keller et al. |
| 4,239,081 A | 12/1980 | Kranz |
| 4,260,008 A | 4/1981 | Kranz et al. |
| 4,291,747 A | 9/1981 | Sevastakis |

(Continued)

FOREIGN PATENT DOCUMENTS

DE 4420697 C2 2/1997

(Continued)

OTHER PUBLICATIONS

Lazarev P., et al., "Molecular level homeotropic pn-junction solar cell", Proceeding of the Organic Semiconductor Conference OSC 2008, Frankfurt, Germany, Sep. 29-Oct. 1, 2008.

(Continued)

*Primary Examiner*—Thanh V Pham
*Assistant Examiner*—Mark A Laurenzi, III
(74) *Attorney, Agent, or Firm*—Knoble Yoshida & Dunleavy, LLC

(57) ABSTRACT

A process of making a photovoltaic unit includes steps of simultaneously forming a first layer of n-type material and a second layer of p-type material using a continuous casting process, and continuously bonding the first and second layers to form a p-n junction. The process may be performed using a twin-roll type continuous casting system having a continuous casting mold that includes a first mold compartment for receiving molten n-type material and a second mold compartment for receiving molten p-type material. The molten n-type material and the molten p-type material are gradually solidified into semi-solid shells and are pressed together by opposed casting rolls, creating a metallurgical bond between the n-type material and the p-type material that forms an effective p-n junction. The process permits the large scale efficient manufacturing of photovoltaic units.

16 Claims, 5 Drawing Sheets

U.S. PATENT DOCUMENTS

| | | |
|---|---|---|
| 4,323,419 A | 4/1982 | Wakefield |
| 4,515,650 A | 5/1985 | Chaudhari et al. |
| 4,523,966 A * | 6/1985 | Tsuya et al. .......... 438/490 |
| 4,546,813 A | 10/1985 | Grove et al. |
| 4,552,201 A | 11/1985 | Wood |
| 4,601,324 A | 7/1986 | Artz et al. |
| 4,658,883 A | 4/1987 | Hazelett et al. |
| 4,671,341 A | 6/1987 | Wood |
| 4,674,558 A | 6/1987 | Hazelett et al. |
| 4,679,612 A | 7/1987 | Artz et al. |
| 4,712,602 A | 12/1987 | Kaiser et al. |
| 4,723,590 A | 2/1988 | Yamauchi et al. |
| 4,813,471 A | 3/1989 | Kaiser et al. |
| 4,854,371 A | 8/1989 | Katahira et al. |
| 4,892,132 A | 1/1990 | Asari |
| 4,901,785 A | 2/1990 | Dykes et al. |
| 4,905,753 A | 3/1990 | Shio et al. |
| 4,915,723 A | 4/1990 | Kaneko et al. |
| 4,934,441 A | 6/1990 | Wood et al. |
| 4,972,900 A | 11/1990 | Szczypiorski |
| 4,986,336 A | 1/1991 | Fukase et al. |
| 4,986,339 A | 1/1991 | Miyazawa |
| 5,027,888 A | 7/1991 | Sakaguchi et al. |
| 5,031,688 A | 7/1991 | Burgo et al. |
| 5,065,812 A | 11/1991 | Mizoguchi et al. |
| 5,217,061 A | 6/1993 | Yamauchi et al. |
| 5,238,050 A | 8/1993 | Folder et al. |
| 5,350,009 A | 9/1994 | Mizoguchi et al. |
| 5,372,180 A | 12/1994 | Grocock et al. |
| 5,383,515 A | 1/1995 | Grocock et al. |
| 5,400,849 A | 3/1995 | Sasaki et al. |
| 5,439,046 A | 8/1995 | Miyazawa et al. |
| 5,515,908 A | 5/1996 | Harrington |
| 5,560,421 A | 10/1996 | Tanaka et al. |
| 5,564,491 A | 10/1996 | Harrington |
| 5,588,478 A | 12/1996 | Jin et al. |
| 5,628,359 A | 5/1997 | Legrand et al. |
| 5,660,224 A | 8/1997 | Barbe et al. |
| 5,704,414 A | 1/1998 | Breviere |
| 5,706,882 A | 1/1998 | Fellus et al. |
| 5,836,376 A | 11/1998 | Matsui et al. |
| 5,901,777 A | 5/1999 | Matsumura et al. |
| 5,915,454 A | 6/1999 | Wright et al. |
| 5,964,277 A | 10/1999 | Tanaka et al. |
| 5,996,680 A | 12/1999 | Fukase et al. |
| 6,079,479 A | 6/2000 | Osada et al. |
| 6,082,437 A | 7/2000 | Damasse et al. |
| 6,090,361 A | 7/2000 | Baba et al. |
| 6,145,581 A | 11/2000 | Takeuchi et al. |
| 6,148,901 A | 11/2000 | Damasse et al. |
| 6,202,792 B1 | 3/2001 | Cheong et al. |
| 6,273,178 B1 | 8/2001 | Osada et al. |
| 6,296,046 B1 | 10/2001 | Jeong et al. |
| 6,371,900 B1 | 4/2002 | Kurisu et al. |
| 6,408,222 B1 | 6/2002 | Kim et al. |
| 6,491,089 B1 | 12/2002 | Poirier et al. |
| 6,679,313 B2 | 1/2004 | Poirier et al. |
| 6,843,304 B2 | 1/2005 | Takeuchi et al. |
| 7,021,364 B2 | 4/2006 | Park et al. |
| 7,028,749 B2 | 4/2006 | Liang et al. |
| 7,100,674 B2 | 9/2006 | Kim et al. |
| 7,140,416 B2 | 11/2006 | Bassarutti et al. |
| 7,156,150 B2 | 1/2007 | Zahedi et al. |
| 7,258,157 B2 | 8/2007 | Damasse et al. |
| 7,323,135 B2 | 1/2008 | Choi et al. |
| 7,407,713 B2 | 8/2008 | Kilmer et al. |
| 7,472,740 B2 | 1/2009 | Anderson et al. |
| 7,484,551 B2 | 2/2009 | Blejde et al. |
| 2007/0039544 A1 | 2/2007 | Kaneko |
| 2007/0169684 A1 | 7/2007 | Stoddard |
| 2007/0169685 A1 | 7/2007 | Stoddard |
| 2008/0179037 A1 | 7/2008 | Yoshihara et al. |

FOREIGN PATENT DOCUMENTS

| | | |
|---|---|---|
| EP | 0867405 B1 | 6/2003 |
| EP | 1930483 A1 | 6/2008 |
| EP | 1297577 B1 | 9/2008 |
| JP | 55126528 A | 9/1980 |
| WO | 96/01710 | 1/1996 |
| WO | 0123121 A1 | 4/2001 |
| WO | 2007020706 A1 | 2/2007 |
| WO | 2007084934 A2 | 7/2007 |
| WO | 2007084936 A2 | 7/2007 |
| WO | 2007136420 A2 | 11/2007 |
| WO | 2009014957 A2 | 1/2009 |
| WO | 2009015167 A1 | 1/2009 |
| WO | 2009015168 A1 | 1/2009 |

OTHER PUBLICATIONS

Killmore, C.R., et al., "Development of Ultra-Thin Cast Strip Products by the CASTRIP® Process", Proceeding of AISTech, Indianapolis, Indiana, USA, May 7-10, 2007.

Campbell, P., et al., "The Castrip Process: A Revolutionary Casting Technology, an Exciting Opportunity for Unique Steel Products or a New Model for Steel Micro-Mills?", Proceedings of The Heffernan Symposium, Toronto, Canada, Aug. 2001.

* cited by examiner

SYSTEM AND METHOD FOR MAKING A PHOTOVOLTAIC UNIT

BACKGROUND OF THE INVENTION

1. Field of the Invention

This invention relates broadly to the field of renewable energy, and more specifically to systems and methods for fabricating photovoltaic cells and components therefor.

2. Description of the Related Technology

Silicon-based photovoltaic cells have been used for converting light into electricity now for close to 70 years. U.S. Pat. No. 2,402,662 issued on Jun. 25, 1946 (application date May 27, 1941) describes a device made from two sections of the same silicon ingot, one with a columnar structure and the other with a non-columnar structure, those sections having been fused together to form a "Light-Sensitive Electrical Device". In 1954 Bell Laboratories further discovered that sections from silicon ingots doped with different impurities such as boron and phosphorous and fused to each other resulted in a device even more sensitive to light.

The most common material used for manufacturing photovoltaic (PV) cells or solar cells as they are commonly called in the solar industry is the metalloid "silicon," which is the $8^{th}$ most common element in the universe by mass and the $2^{nd}$ most abundant element found in the Earth's crust (after oxygen), forming 25.7% of the Earth's crust by mass.

The most common method of manufacturing silicon-based photovoltaic solar cells is by slicing crystalline silicon billets or boules into thin wafers. One of the boules contains traces of boron or another Group III acceptor as the impurity, making it the p-type (positive) material and the other contains traces of phosphorus or another Group V type donor as the impurity making it the n-type (negative) material. Once wafers from each of these boules are fused together and further processed, they form the semi-conductor device known as a photovoltaic cell.

The conventional process of manufacturing a PV cell is very complicated, with multiple steps such as sawing the silicon billets into wafers, grinding the surfaces, etching the surfaces, fusing them together, and so forth. The physical size of the silicon wafer is limited by the billet size and has evolved over time from 25.4 mm (1 inch) to 300 mm (11.8 inches). Efforts are now underway to increase the size from 300 mm to 450 mm (17.7 inches).

A more recent manufacturing process for silicon-based PV solar cells was first described in U.S. Pat. No. 4,661,200, issued on Apr. 28, 1987 as a "String Stabilized Ribbon Growth" and later in U.S. Pat. No. 4,689,109 issued Aug. 25, 1987 as a method of initiating or seeding the growth of a crystalline or polycrystalline ribbon. This process draws a pair of strings or filaments through a shallow crucible of molten silicon, which spans the space between them like a wand through a soap solution forming a "ribbon" of thin silicon. This eliminates the step of sawing the silicon wafers from a solid billet or boule of silicon, which in turn can reduce the 45% loss of expensive silicon material that occurs during the sawing process.

The string ribbon process permits manufacture of an effective solar cell with enormous savings of time and material. That represents a major step in reducing the cost of solar energy to make it more cost competitive with the current carbon-based methods of mass producing electricity. However, the scale of solidifying a ribbon between two strings has obvious limitations that prevent it from being the quantum leap needed to move the solar industry from its current position as an alternative energy source to one of being a primary energy source in the world today.

Twin-roll casting, or drum casting as it is sometimes called, is a well-known continuous casting process for manufacturing steel and aluminum sheets. The original concept is described in U.S. Pat. No. 49,053 dated Jul. 25, 1865 as "An improvement in the manufacture of iron and steel." However, the process did not reach its full potential until the $21^{st}$ century when computerized control systems were able to accurately match the feed rate of the liquid metal pool with the speed of the rotating drums. Continuous casting processes such as twin-roll casting permit the efficient manufacture of large quantities of metallic materials having a relatively thin form factor.

U.S. Pat. No. 4,108,714 to Keller et al. discloses the fabrication of a wide ribbon of silicon sheet material, to be used in the manufacture of solar cells, from a molten silicon stream passing through the nip between spaced apart rollers. However, manufacture of solar cells using this process would require two sheets of such material be subjected to a number of additional manufacturing steps, including doping the sheets, grinding the surfaces, etching the surfaces and fusing them together in order to create the necessary p-n junction.

A need exists for a system and method that will permit the large scale fabrication of photovoltaic units having a p-n junction more cost-effectively than has heretofore been achieved.

SUMMARY OF THE INVENTION

Accordingly, it is an object of the invention to provide a system and method that will permit the large scale fabrication of photovoltaic units having a p-n junction more cost-effectively than has heretofore been achieved.

It is further an object of one embodiment of the invention to provide a more cost effective process for manufacturing silicon-based photovoltaic solar cells from large sheets of silicon continuously poured and passing through a small gap between two opposed counter-rotating casting rollers.

A further objective of one embodiment of the invention is to separate the pouring cavity lengthwise between the two rollers into two sides and to fill one side with p-type silicon and the other side with n-type silicon and to metallurgically join the opposing solidifying sheets of silicon together just before they exit through a small gap between the two opposed counter-rotating casting rollers thus producing a metallurgically-bonded photovoltaic solar cell in one single step.

In order to achieve the above and other objects of the invention, a method of making a photovoltaic unit according to a first aspect of the invention includes simultaneously forming a first layer of n-type material and a second layer of p-type material using a continuous casting process; and continuously bonding the first and second layers to form a p-n junction.

A method of making a photovoltaic unit according to a second aspect of the invention includes steps of supplying a molten n-type material to a continuous casting mold; supplying a molten p-type material to the continuous casting mold; and continuously casting a photovoltaic unit having a p-n junction from the molten n-type material and the molten p-type material using the continuous casting mold.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 1:
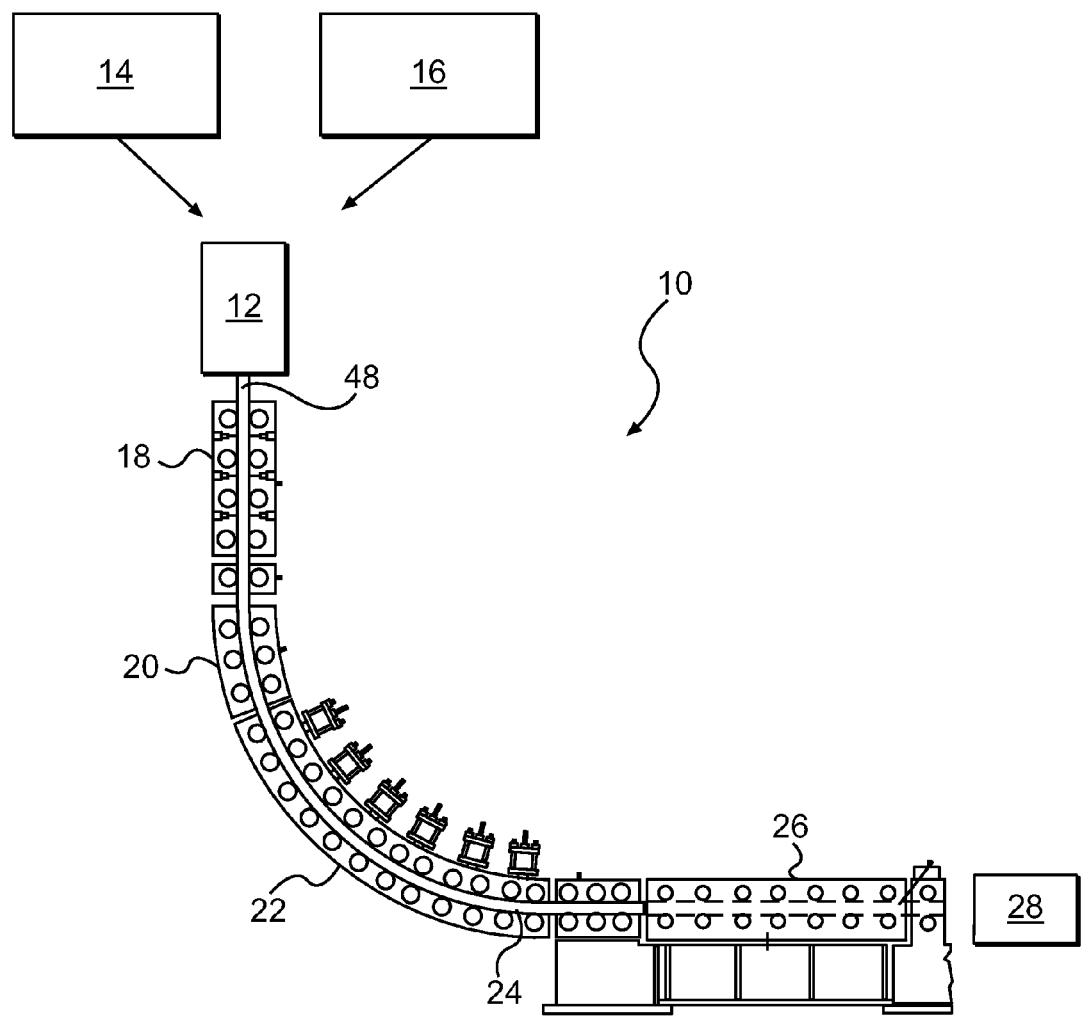
FIG. 1 is a diagrammatical depiction of a system for making a photovoltaic unit that is constructed according to a first embodiment of the invention.

Referring now to the drawings, wherein like reference numerals designate corresponding structure throughout the views, and referring in particular to FIG. 1, a system 10 for making a photovoltaic unit includes a continuous casting mold 12, a first tundish 14 for supplying molten n-type material to the continuous casting mold 12 and a second tundish 16 for supplying molten p-type material to the continuous casting mold 12.

As will be described in greater detail below, and particularly in reference to FIG. 2, system 10 is constructed and arranged to continuously form a photovoltaic unit 48 having a p-n junction by simultaneously forming a first layer 50 of n-type material and a second layer 52 of p-type material that are metallurgically bonded together using a continuous casting process.

As is shown in FIG. 1, system 10 includes a vertical guide roll rack 18 for receiving the photovoltaic unit 48 from the continuous casting mold 12 and guiding it vertically downward. System 10 further includes a bending roll unit 20, a curved roll rack 22 and a straightener roll rack 24 for gradually re-orienting the photovoltaic unit 48 from the cast vertical orientation into a horizontal orientation.

A horizontal roll rack 26 guides the continuous sheet of photovoltaic unit 48 into a cutting and shaping assembly 28, where it is divided into smaller portions for assembly into a photovoltaic cell. The curvature of the system 10 is preferably over a large radius (at least 10 meters) before it reaches a horizontal position. A series of driven roll pairs may be periodically spaced along transport path to support the weight and control the withdrawal speed of the photovoltaic unit from the continuous casting mold 12.

Figure 2:
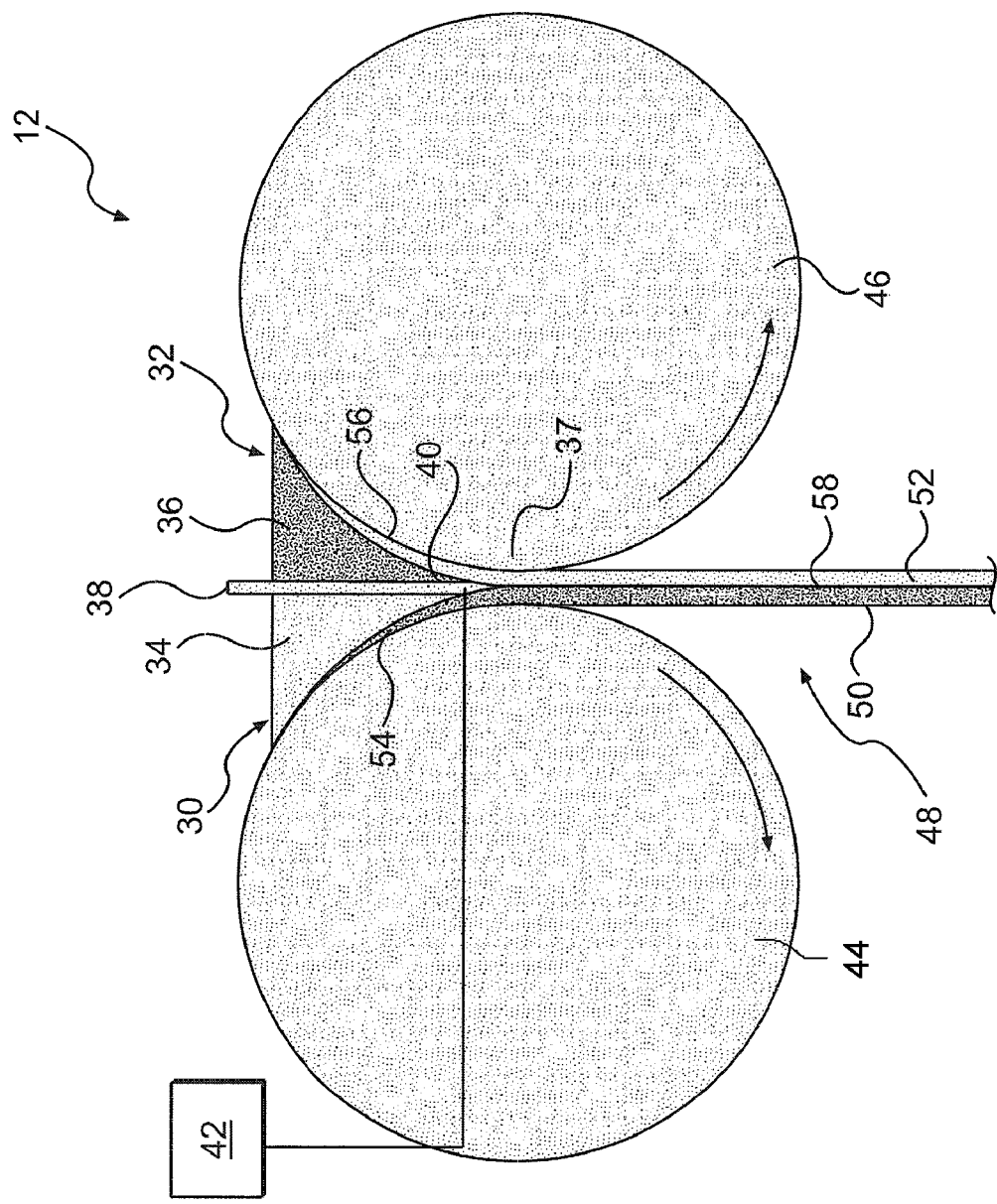
FIG. 2 is a diagrammatical depiction of a mold assembly in the embodiment shown in FIG. 1.

Referring now to FIG. 2, it will be seen that the continuous casting mold 12 preferably includes a first mold compartment 30 and a second mold compartment 32 that is separated from the first mold compartment 30 by a separating dam 38. The continuous casting mold 12 is accordingly partitioned lengthwise by the separating dam 38.

The first mold compartment 30 is constructed and arranged to hold molten n-type material 34 received from the first tundish 14, and is defined in part by a first casting roll 44. The second mold compartment 32 is constructed and arranged to hold molten p-type material 36 received from the second tundish 16, and is defined in part by a second casting roll 46.

A casting throat 37 is defined at a lower portion of the continuous casting mold 12 as the gap between the two casting rolls 44, 46.

The first casting roll 44 is preferably liquid-cooled and is mounted to rotate in a clockwise direction as viewed in FIG. 2. The second casting roll is also preferably liquid-cooled and is mounted to rotate in a counterclockwise direction as viewed in FIG. 2.

The molten n-type material 34 preferably is formulated of molten silicon that has been doped with a known n-type doping additive such as phosphorus (P), arsenic (As), or antimony (Sb). The molten p-type material 36 preferably is formulated of molten silicon that has been doped with a known p-type additive such as boron (B), aluminum (Al) or Gallium (Ga). Any known n or p type doping formulation, respectively, could be used in either the molten n-type material 34 or the molten p-type material 36.

The base silicon material is preferably heated to a molten state in a furnace, such as an electric arc furnace, from pellets or bricks that have already been partially purified. It is then preferably transported to another furnace for its final refinement and doping, then each of the n-type and p-type molten materials 34, 36 is conveyed to the system 10 in a ladle. At the system 10 the respective n-type and p-type molten materials 34, 36 are poured from the ladle into the respective tundishes 14, 16 in order to float off refractory impurities. The respective n-type and p-type molten materials 34, 36 are then poured from the tundishes 14, 16 into the respective first and second mold compartments 30, 32.

The lowermost end of the separating dam 38 terminates at a tapered tip 40 that is proximate the casting throat 37, and in the preferred embodiment is provided with a heating element 42, which is preferably an electric resistance type heating element.

In operation, a photovoltaic unit 48 having a p-n junction 58 is continuously fabricated as a thin strip having an n-layer 50 and a p-layer 52 using the continuous casting mold 12. The molten n-type material 34 in the first mold compartment 30 is gradually cooled by contact with the first casting roll 44, forming a semi-solidified shell 54 that gradually increases in thickness as it nears the casting throat 37. Simultaneously, the molten p-type material 36 in the second mold compartment 32 is gradually cooled by contact with the second casting roll 46, forming a semi-solidified shell 56 that gradually increases in thickness as it nears the casting throat 37.

The interior surfaces of the respective shells 54, 56 are preferably heated by the heater 42 near the tapered lower tip 40 of the separating dam 38. The semi-solidified shells 54, 56 are then pressed together by the casting rolls 44, 46 at the casting throat 37, thereby forming a continuous metallurgical bond between the inner surfaces thereof and forming the integral photovoltaic unit 48 having an effective p-n junction 58.

The continuous bonding of the first and second layers 50, 52 to form the p-n junction 58 is thus performed while said first and second layers 50, 52 are still at elevated temperatures from the continuous casting process.

By heating the respective inner surfaces of the layers 50, 52 using the heater 40, the continuous bonding of the first and second layers 50, 52 to form the p-n junction 58 may be performed while at least a portion of one of the first and second layers 50, 52 is in a semi-molten state, which facilitates the formation of a metallurgical bond between the layers 50, 52. By controlling the degree of heating that is provided by the heater 42, the amount of mixing of the n-type material and the p-type material that occurs during the formation of the p-n junction, and thereby the thickness of the p-n junction can also be controlled.

By adjusting the cooling that is provided by the respective casting rolls 44, 46, the respective thicknesses of the first and second layers 50, 52 can be adjusted. For example, by circulating a greater volume of coolant through the casting roll 46 than is provided to casting roll 44, the thickness of the semi-solidified shell 56 can be formed to be thicker than the shell 54, causing the p-layer 52 to be formed to be thicker than the n-layer 50.

Alternatively, the process described above could be performed without the heater 42, or by configuring the heater 42 so that it applies heat to only of the inners surfaces of the respective semi-solidified shells 54, 56. Use of the heater 42 is preferred, however, because it promotes the formation of a secure metallurgical bond between the layers 50, 52. In addition, the heater 42 may provide an annealing effect that will reduce crystalline disorder proximate to the p-n junction 58 and thereby improve the photovoltaic efficiency. One or more of the layers 50, 52 of the photovoltaic unit may also be heated downstream of the continuous casting mold 12 in order to further reduce crystalline disorder and promote efficiency.

Figure 3:
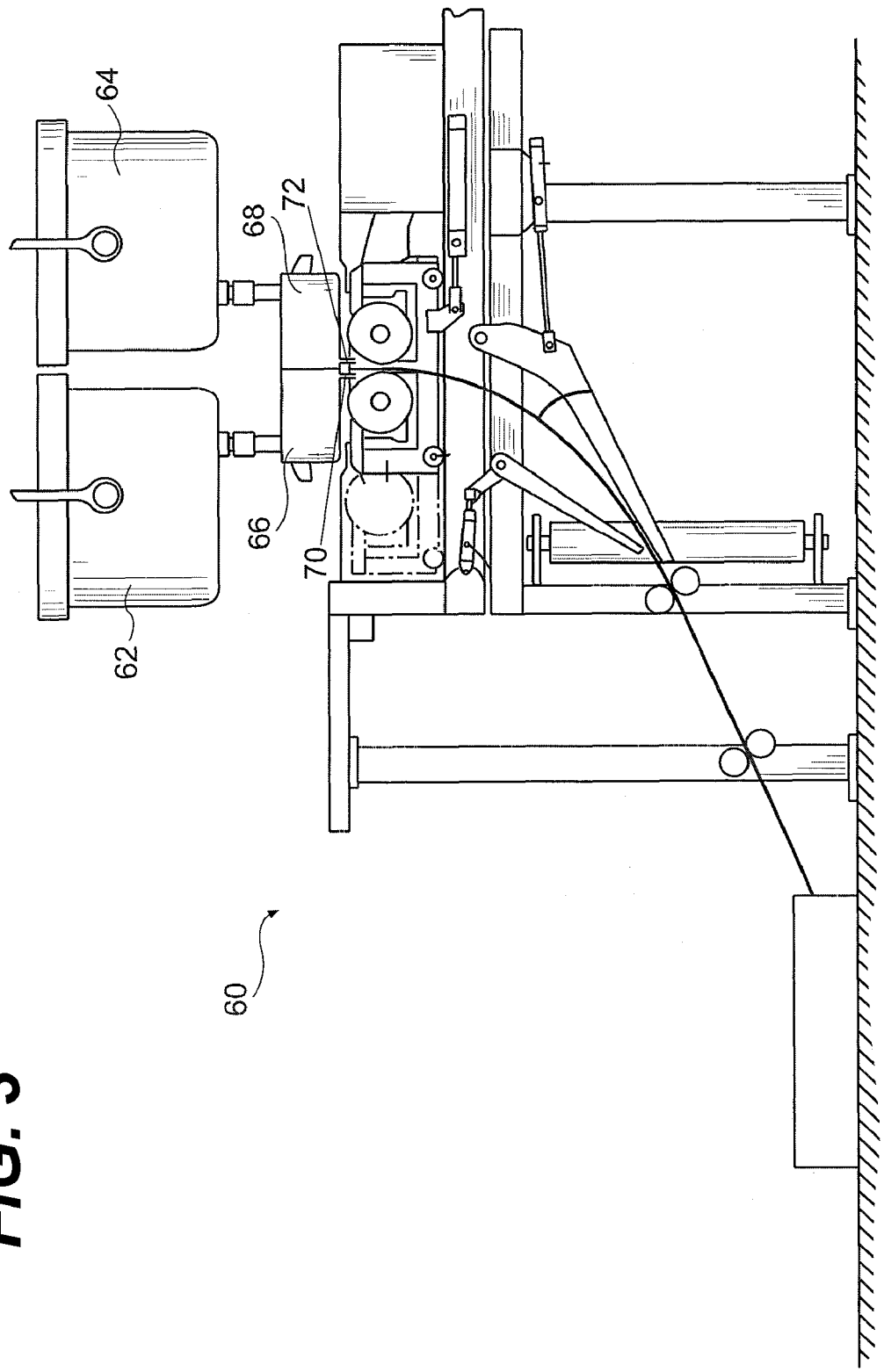
FIG. 3 is a diagrammatical depiction of a system for making a photovoltaic unit that is constructed according to a second embodiment of the invention.

A system 60 for making a photovoltaic unit that is constructed according to an alternative embodiment of the invention is shown in FIG. 3. System 60 includes first and second ladles 62, 64 that are adapted to respectively feed molten n-type material and molten p-type material into first and second tundishes 66, 68. In the second embodiment, the silicon material is also preferably heated to a molten state from pellets or bricks that have already been partially purified. It is then preferably transported to another furnace for its final refinement and doping, then the respective n-type and p-type molten materials are provided to the system 60 in the respective ladles 62, 64.

The first and second tundishes 66, 68 are adapted to continuously feed the respective molten n-type and p-type materials respectively through distribution nozzles 70, 72 into the first and second mold compartments 30, 32 of the continuous casting mold 12, which is otherwise constructed identically to the continuous casting mold 12 described above with reference to the first embodiment.

Figure 4:
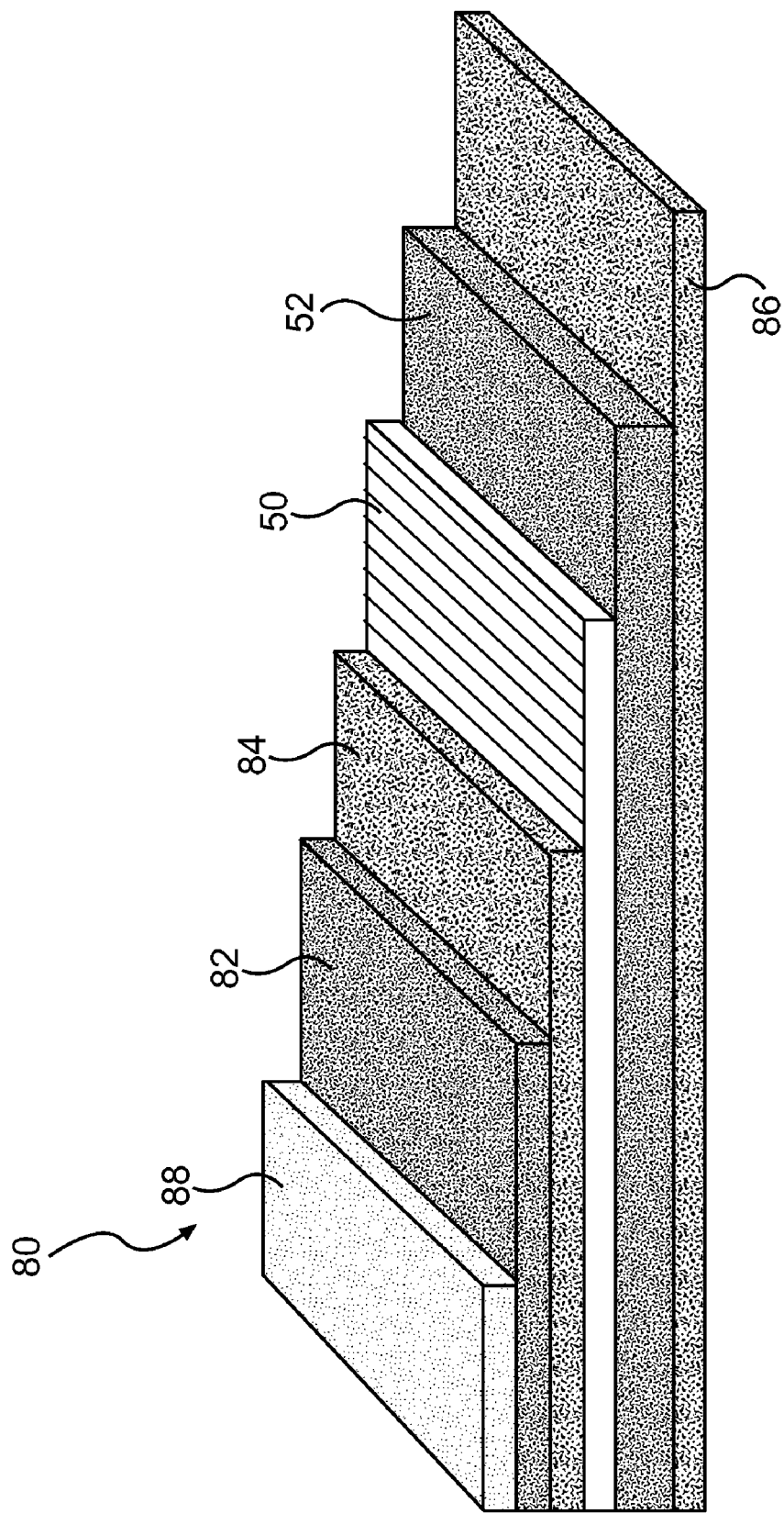
FIG. 4 is a diagrammatical depiction of a method of making a photovoltaic cell according to a preferred embodiment of the invention.

After the photovoltaic unit 48 is cut and formed by the cutting and shaping assembly 28, where it is divided into smaller portions, assembly of a photovoltaic cell 80 may be completed by bonding according to known and conventional processes an anti-reflective coating 82 and conductor strips 84 to one surface of the photovoltaic unit 48 and a conductive metallic backing plate 86 to the opposite surface. As FIG. 4 shows, a transparent cover plate 88 may be secured on top of the anti-reflective coating 82.

Figure 5:
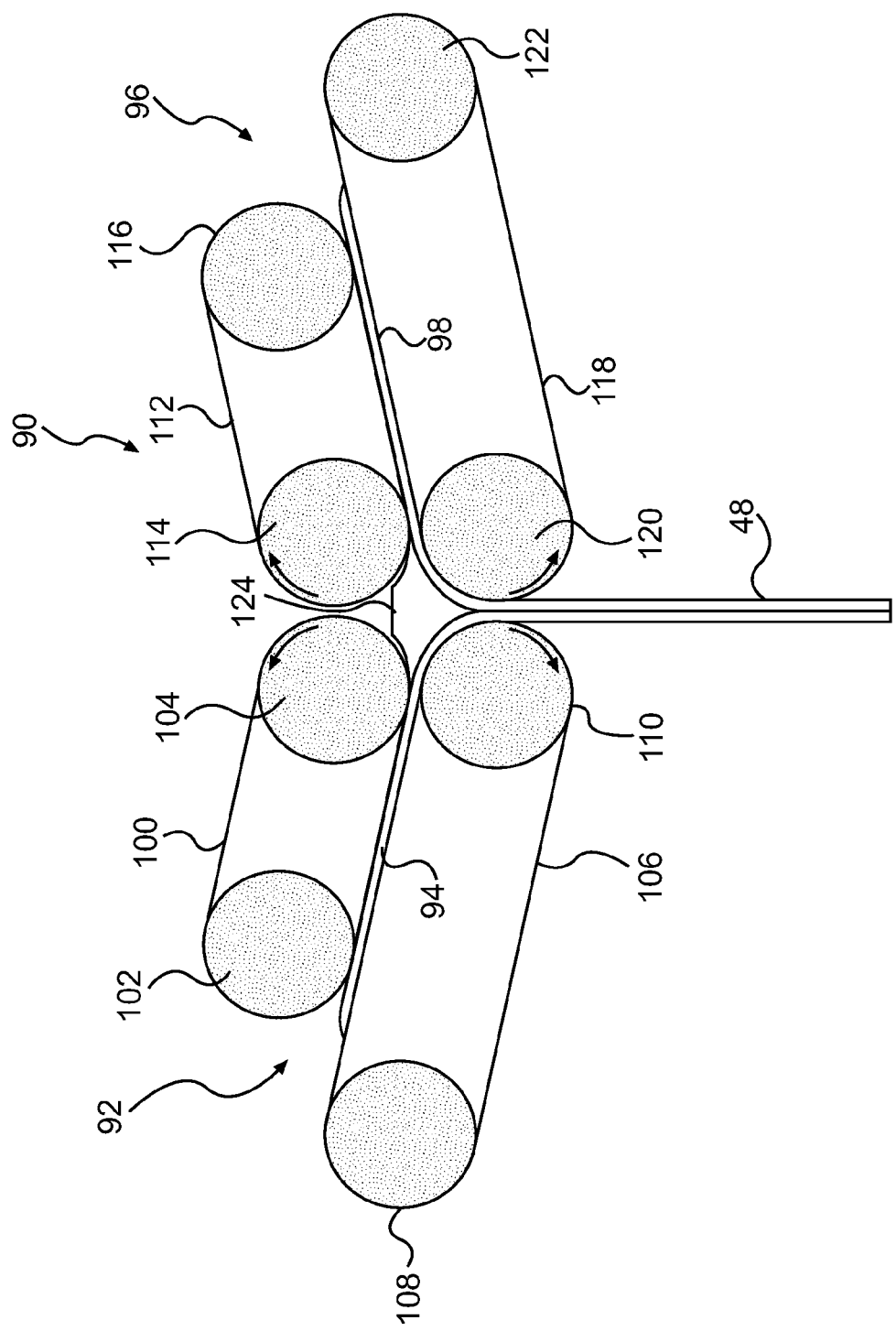
FIG. 5 is a diagrammatical depiction of a system and method for making a photovoltaic unit according to a second embodiment of the invention.

According to an alternative embodiment that is shown in FIG. 5, a twin-belt casting system 90 could be used to continuously fabricate the photovoltaic unit 48 in lieu of the roll casting system 10. The twin-belt casting system 90 preferably includes a first belt casting assembly 92 for casting an n-type shell 94 and a second belt casting assembly 96 for casting a p-type shell 98. The first belt casting assembly 92 includes a first upper casting belt 100 that travels about rollers 102, 104, and a first lower casting belt 106 that travels about rollers 108, 110. The second belt casting assembly includes a second upper casting belt 112 that travels about rollers 114, 116 and a second lower casting belt 118 that travels about rollers 120, 122.

The lower casting belts 106, 118 are constrained by rollers 110, 120 to form a casting throat in which the inner surfaces of the shells 94, 98 are pressed together in order to facilitate metallurgical bonding of the shells 94, 98.

In twin-belt casting, the initial solidification of the shells 94, 98 occurs once on the respective lower belt 106, 118 and once on the respective 100, 112 upper belt and those two shells 94, 98 continue to grow from the liquid center of the shell until they meet at the center. Thickness of either wall of either shell 94, 98 can be adjusted by adjusting the temperature of the respective belt. In addition, by keeping the upper belts 100, 112 relatively hot, the side of the respective shells that is to be bonded with the other shell in order to form the photovoltaic unit 48 could be kept soft in a semi-molten state order to facilitate metallurgical bonding.

A heating and guiding unit 124 is also preferably provided that includes a source of heat such as an electric resistance heater for applying additional heat to the upper surface of one or both of the shells 94, 98. Further softening or re-melting of the upper shell surfaces by the heating and guiding unit 124 could further facilitate metallurgical bonding. By keeping the upper shell on each side from growing very fast by keeping the belt 100, 112 hot and/or by using the heating or guiding unit 124, it would also be possible to use the system 90 to continuously cast in a horizontal or near-horizontal configuration.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A method of making a photovoltaic unit, comprising:
   simultaneously forming a first layer of n-type material and a second layer of p-type material using a continuous casting process; and
   continuously bonding said first and second layers to form a p-n junction.

2. A method of making a photovoltaic unit according to claim 1, wherein said step of continuously bonding said first and second layers to form a p-n junction is performed while said first and second layers are still at elevated temperatures.

3. A method of making a photovoltaic unit according to claim 2, wherein said step of continuously bonding said first and second layers to form a p-n junction is performed while at least a portion of one of said first and second layers is in a semi-molten state.

4. A method of making a photovoltaic unit according to claim 3, further comprising a step of providing additional heating to at least one surface of at least one of said first and second layers that is to be bonded to a surface of the other of said first and second layers in order to form the p-n junction.

5. A method of making a photovoltaic unit according to claim 1, wherein said step of simultaneously forming a first layer of n-type material and a second layer of p-type material using a continuous casting process is performed using a continuous casting mold having a first mold compartment holding a molten n-type material; a second mold compartment holding a molten p-type material; and a separating dam defining a divider between said first and second mold compartments.

6. A method of making a photovoltaic unit according to claim 1, wherein said step of simultaneously forming a first layer of n-type material and a second layer of p-type material is performed using a continuous casting machine having a first casting roll for forming and cooling one of said first and second layers.

7. A method of making a photovoltaic unit according to claim 6, wherein said step of simultaneously forming a first layer of n-type material and a second layer of p-type material is further performed using a second casting roll for forming and cooling the other of said first and second layers.

8. A method of making a photovoltaic unit according to claim 1, wherein at least one of said n-type material and said p-type material comprises silicon.

9. A method of making a photovoltaic unit, comprising:
supplying a molten n-type material to a continuous casting mold;
supplying a molten p-type material to the continuous casting mold; and
continuously casting a photovoltaic unit having a p-n junction from said molten n-type material and said molten p-type material using said continuous casting mold.

10. A method of making a photovoltaic unit according to claim 9, wherein said step of supplying a molten n-type material is performed using a first tundish, and said step of supplying a molten p-type material to the continuous casting mold is performed using a second tundish.

11. A method of making a photovoltaic unit according to claim 9, wherein said step of supplying a molten n-type material is performed by supplying the molten n-type material to a first mold compartment of the continuous casting mold, and wherein said step of supplying a molten p-type material is performed by supplying the molten p-type material to a second mold compartment of the continuous casting mold.

12. A method of making a photovoltaic unit according to claim 9, wherein said step of continuously casting a photovoltaic unit having a p-n junction is performed by using a first casting roll that is integral with said continuous casting mold to form and cool one of the molten n-type material and the molten p-type material into a first semi-solid shell.

13. A method of making a photovoltaic unit according to claim 12, wherein said step of continuously casting a photovoltaic unit having a p-n junction is further performed using a second casting roll to form and cool the other of the molten n-type material and the molten p-type material into a second semi-solid shell.

14. A method of making a photovoltaic unit according to claim 13, wherein said step of continuously casting a photovoltaic unit having a p-n junction is further performed by pressing said first and second semi-solid shells together to form a bonded p-n junction.

15. A method of making a photovoltaic unit according to claim 14, wherein said step of pressing said first and second semi-solid shells together to form a bonded p-n junction is performed by the first and second casting rolls.

16. A method of making a photovoltaic unit according to claim 13, wherein said step of continuously casting a photovoltaic unit having a p-n junction is further performed by applying additional heating to a surface of at least one of said first and second semi-solid shells that is opposite from the respective casting roll.

* * * * *